United States Patent
Eckert

(10) Patent No.: US 11,040,621 B2
(45) Date of Patent: Jun. 22, 2021

(54) INPUT DEVICE HAVING AN ACTUATION PART AND A MAGNETIC MEASURING FIELD FOR DETERMINING A POSITION PARAMETER OF THE ACTUATION PART

(71) Applicant: PREH GMBH, Bad Neustadt a. d. Saale (DE)

(72) Inventor: Thomas Eckert, Mellrichstadt (DE)

(73) Assignee: PREH GMBH, Bad Neustadt a.d. Saale (DE)

( * ) Notice: Subject to any disclaimer, the term of this patent is extended or adjusted under 35 U.S.C. 154(b) by 149 days.

(21) Appl. No.: 16/327,211

(22) PCT Filed: Sep. 21, 2017

(86) PCT No.: PCT/EP2017/073891
§ 371 (c)(1),
(2) Date: Feb. 21, 2019

(87) PCT Pub. No.: WO2018/077545
PCT Pub. Date: May 3, 2018

(65) Prior Publication Data
US 2021/0001725 A1    Jan. 7, 2021

(30) Foreign Application Priority Data
Oct. 28, 2016  (DE) .................... 10 2016 120 638.5

(51) Int. Cl.
*G06F 3/041* (2006.01)
*B60K 37/06* (2006.01)
*H03K 17/97* (2006.01)

(52) U.S. Cl.
CPC ............ *B60K 37/06* (2013.01); *H03K 17/97* (2013.01); *B60K 2370/131* (2019.05); *H03K 2017/9706* (2013.01)

(58) Field of Classification Search
USPC .......... 345/156, 173, 174; 701/36; 715/747; 725/59
See application file for complete search history.

(56) References Cited

U.S. PATENT DOCUMENTS

2015/0193007 A1*  7/2015  Ricci ................ B60R 21/01512
701/36
2015/0339031 A1* 11/2015  Zeinstra ............. G06F 3/04842
715/747

(Continued)

FOREIGN PATENT DOCUMENTS

DE        4311973 A1    2/1997
DE    102007024874 A1   12/2008
(Continued)

OTHER PUBLICATIONS

The International Search Report and the Written Opinion for PCT/EP2017/073891, dated Mar. 5, 2018, ISA/EPO, Rijswijk, The Netherlands.

*Primary Examiner* — Thuy N Pardo
(74) *Attorney, Agent, or Firm* — M&B IP Analysts, LLC

(57) ABSTRACT

The present disclosure relates to an input device of a vehicle user interface with a housing, with a detection device assigned to the housing, with an evaluation unit connected to the detection device in an electrically conductive manner, and with an actuating member movably mounted on the housing, wherein the actuating member cooperates with the detection device via a magnetic measuring field, e.g. a static magnetic field or an alternating magnetic field, in order to transmit to the evaluation unit at least one position parameter related to a position and/or a change of position of the actuating member relative to the housing, wherein the evaluation unit is designed to carry out a switching or controlling function of a vehicle component depending on the position parameter.

8 Claims, 1 Drawing Sheet

(56) References Cited

U.S. PATENT DOCUMENTS

| | | | |
|---|---|---|---|
| 2016/0038832 A1 | 2/2016 | Chabin et al. | |
| 2016/0255408 A1* | 9/2016 | Ricci | G06F 11/3065 |
| | | | 725/59 |
| 2018/0226077 A1* | 8/2018 | Choi | B60K 35/00 |
| | | | 345/173 |
| 2018/0373350 A1* | 12/2018 | Rao | G06F 3/038 |
| | | | 345/173 |
| 2019/0095050 A1* | 3/2019 | Gruber | G06F 3/0481 |
| | | | 345/173 |
| 2019/0278454 A1* | 9/2019 | Washeleski | G06F 3/0416 |
| | | | 345/174 |
| 2019/0279447 A1* | 9/2019 | Ricci | B60Q 9/00 |
| | | | 345/174 |
| 2020/0139814 A1* | 5/2020 | Galan Garcia | B60K 35/00 |
| | | | 345/156 |

FOREIGN PATENT DOCUMENTS

| | | |
|---|---|---|
| DE | 102008023651 A1 | 11/2009 |
| DE | 102011006048 A1 | 12/2011 |
| DE | 102011111871 A1 | 2/2013 |
| DE | 102016005141 A1 | 11/2016 |
| WO | 2018077545 A1 | 5/2018 |

* cited by examiner

INPUT DEVICE HAVING AN ACTUATION PART AND A MAGNETIC MEASURING FIELD FOR DETERMINING A POSITION PARAMETER OF THE ACTUATION PART

This application claims priority under 35 U.S.C. § 371 to the International Application No. PCT/EP2017/073891, filed Sep. 21, 2017, and to the German Application No. 10 2016 120 638.5, filed Oct. 28, 2016, now pending, the contents of which are hereby incorporated by reference.

The invention relates to an input device with a detection device and a movably mounted actuating member, wherein the detection device is designed to detect a position and/or a change of position in order to associate it with at least one position parameter transmitted to an evaluation unit associated with the input device, so that the former is able to assign a switching or controlling function of a vehicle component to this parameter.

Previously known input devices include actuating members that are movably mounted on a housing and whose position and/or change in position is detected contactlessly. Furthermore, it is known to movably mount an actuating member on a touch-sensitive input surface in order to be able to use the detection device assigned to the touch-sensitive input surface not only for touch detection on the input surface, but also for the position detection of the actuating member. At the same time, the use of a movably mounted actuating member instead of a vehicle user interface, in which inputting is possible only via a touch-sensitive input surface, i.e. a "simple" touchpad or "simple" touchscreen, increases operational safety and operational comfort because the operator is still accustomed to conventional input devices with movably mounted actuating members, and, on the other hand, operation can be carried out even without visual checks and thus without distraction from the traffic situation, by grasping the actuating member and a haptic feedback generated in this manner. Previous approaches of the latter principle so far made use of capacitive touch detection, by the actuating member disposed on a capacitive touchscreen or capacitive touchpad interacting with the respective measuring capacitance. However, it was found that this technology is susceptible to errors due to foreign bodies, such as liquids, and is further disadvantageous in that the positional detection cannot be carried out with sufficient reliability, particularly if the object is to detect small positional changes, such as changes in the pivoting position, of the actuating member, and if, further, many calibration steps are required during operation in order to ensure reliable function. In cars, capacitive detection has proved to be susceptible to errors due to interference fields or the operator being statically charged. Furthermore, operation with a finger wearing a glove is not possible in the case of capacitive detection.

Against this background, there was a need for a solution for an input device with, in comparison, a more reliable position detection operating in a contactless manner, which, in particular, is inexpensive to produce, and whose functional reliability can be permanently ensured in an improved manner. This object is achieved with an input device according to claim 1. An equally advantageous use is the subject matter of the independent use claim. Advantageous embodiments are in each case the subject matter of the dependent claims. It must be noted that the features cited individually in the claims can be combined with each other in any technologically meaningful manner and represent other embodiments of the present disclosure. The description, in particular in connection with the figures, additionally characterizes and specifies the present disclosure.

The present disclosure relates to an input device of a vehicle user interface. The vehicle user interface in the sense of the present disclosure means a device for performing control inputs related to the vehicle or vehicle components. Inter alia, the user, also referred to as operator, is understood to be the driver of the vehicle. In addition to the input device according to the present disclosure, the vehicle user interface generally has further components, e.g. an electronic pixel matrix display or other input device suitable for performing manual inputting.

According to the present disclosure, the input device has a housing and a detection device assigned to the housing. Further, the input device has an evaluation unit connected to the detection device in an electrically conductive manner. The input device further includes an actuating member movably mounted on the housing. The actuating member cooperates with the detection device via a magnetic measuring field, e.g. a static magnetic field or an alternating magnetic field, in order to transmit to the evaluation unit at least one position parameter related to a position and/or a change of position of the actuating member relative to the housing. According to the present disclosure, the evaluation unit is designed to cause or carry out a switching or controlling function of a vehicle component depending on the position parameter. For example, a temperature preselection of the air-conditioning control of the vehicle is carried out depending on the position of the actuating member. By using a magnetic measuring field, the operating input can be carried out in a manner less susceptible to error, e.g. compared to an operating input based on capacitive detection means.

The actuating member is not limited with respect to its movable mounting on the housing; thus, a displaceable, rotatable or pivotable mounting of the actuating member or combinations of these movement capabilities are conceivable. For example, the input device is a simple slide control, e.g. an input device with an actuating member that is mounted on the housing in a substantially linearly displaceable manner.

According to a preferred embodiment, the actuating member is rotatably mounted on the housing. According to another preferred embodiment, the actuating member is pivotably mounted on the housing. Most preferred is an embodiment in which a combination of a pivotable and rotatable mounting of the actuating member relative to the housing is provided. For example, a cardanic mounting or a ball-and-socket mounting is provided between the housing and the actuating member. Further, according to another embodiment, a push-moving capability is realized, which can be combined with rotatability and/or pivotability and in which the actuating member is mounted in such a way that it can be moved from a rest position into a pushed position against a restoring force, in order to assign an additional switching function to this actuation. In this case, means for detecting the actuating force may optionally be provided.

Preferably, the detection device comprises an array of means generating the magnetic measuring field, e.g. a transmitting antenna structure. For example, the transmitting antenna structure is disposed on a plane surface adjacent to a surface of the housing. Due to the assembly of a structure consisting of several transmitting antennas, a spatially resolving detection of the position of the actuating member can be realized in an improved manner. For example, the distance between adjacent means generating the magnetic measuring field is smaller than the smallest dimension of the actuating member.

According to a preferred embodiment, it is provided that the means generating the magnetic field are moved synchronously with the actuating member, i.e. that the actuating member is equipped to generate the magnetic measuring field detected by the detection device. Preferably, the magnetic measuring field is a static magnetic field. Most preferably, a permanent magnet for generating the static magnetic measuring field is attached to the actuating member.

In the above-mentioned embodiment, the detection device preferably has at least one Hall sensor, e.g. a Hall sensor detecting in 3 orthogonal spatial axes.

According to a preferred embodiment, at least one conductor, in particular a conductor coil, which is disposed, for example, inside the actuating member, is assigned to the actuating member. An assignment is understood to be an attachment of the conductor to the actuating member, so that the conductor moves along with the movement of the actuating member.

Preferably, the actuating member includes a resonant circuit consisting of at least one conductor coil and at least one capacitor, and the detection device is designed to detect a resonance field of a current induced in the resonant circuit by the magnetic measuring field. Thus, a movement of the resonance field in the measuring field occurs in the case of the actuating member being moved manually. Thus, a precise detection of the position and/or the change of position of the actuating member can be obtained. For example, the electromagnetic resonance field is detected by several of the receiving antennas assigned to the detection device. For example, the resonance field is detected subsequent to the magnetic measuring field having been turned off, due to the resonance current which is induced in the resonant circuit and outlasts the measuring field. Preferably, an alternating, preferably periodic, generation of the measuring field comprising turn-on and turn-off phases is provided, wherein the electromagnetic resonance field caused by the resonance current induced due to the measuring field is measured in the turn-off phase. In order to obtain a precise determination of position, i.e. spatial resolution, in the position detection, a high rate, i.e. a short period in time, is aimed at as a matter of principle; e.g., the duration of the turn-on or turn-off phase is in each case less than 20 µs.

In one embodiment, the input device has several actuating members, wherein one resonant circuit is assigned to each of the actuating members, whose electromagnetic resonance fields differ. For example, this is achieved by varying the coil and/or the capacitor. Thus, the various actuating members or their position can be identified by the detection device.

According to another embodiment, the resonant circuit is arranged such that the electromagnetic resonance field is influenced by the touch of an actuating member of an operator. For example, the operator is coupled into the resonant circuit in an electrically conducting manner via an electrically conductive touching contact. For example, the operating person can thus be identified based on their individual body capacitance. Embodiments are also conceivable in which a specific body capacitance is applied to the operator, e.g. via the seat contact, in order thus to be able, for example, to differentiate an operation by the driver from one by the front passenger by means of the detection device. According to another embodiment, an identification of an operator based on a specific resonance field influenced by his touching the actuating member is carried out by the detection device.

Furthermore, the present disclosure relates to the use of the input device in one of its above-described embodiments in a motor vehicle.

The present disclosure is explained further with reference to the following figures. The Figures are to be understood only as examples and merely represent a preferred embodiment. In the Figures.

Figure 1:
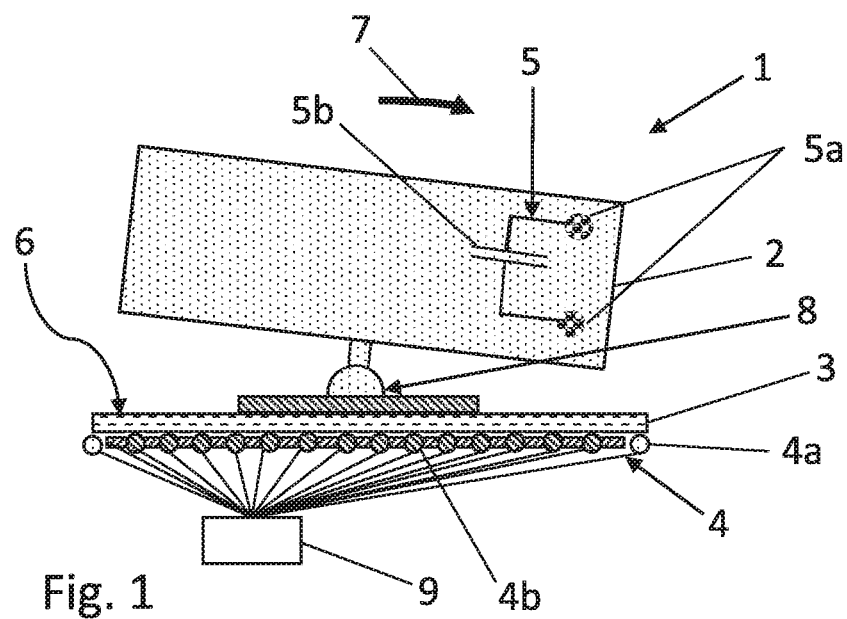
FIG. 1 shows a vertical sectional view through an embodiment of the input device according to the present disclosure.
Figure 2:
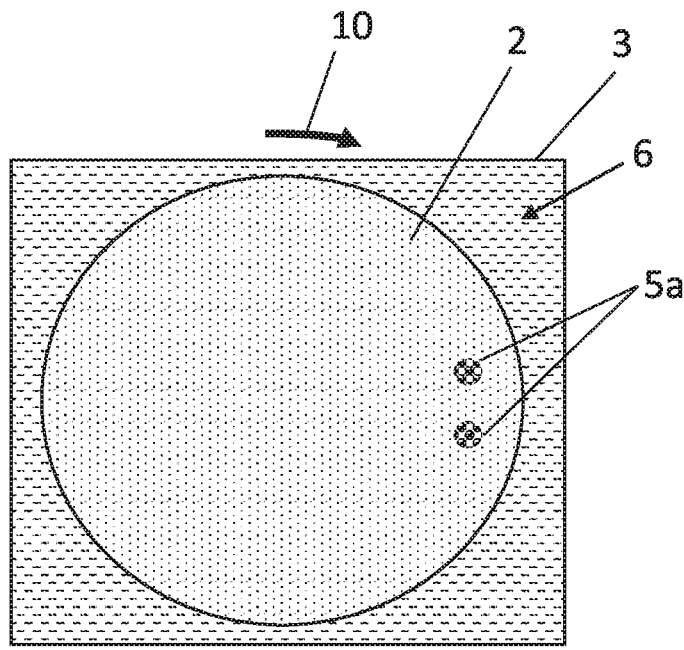
FIG. 2 shows a horizontal sectional view through an embodiment of the input device according to the present disclosure.

FIG. 1 shows an embodiment of the input device 1 according to the present disclosure. It has a housing 3 defining a plane surface 6 facing towards the operator. On the surface 6, an actuating member 2 is movably mounted on the housing 3 by means of the mounting means 8. The latter are configured as a ball-and-socket mounting and allow for pivotability 7, as shown in FIG. 1, and rotatability 10, as shown in FIG. 2, of the actuating member 2 with respect to the housing 3. A detection device 4 is provided adjacent to the surface 6 of the housing 3. The detection device 4 has an array of transmitting antennas 4b that can be selectively controlled by the evaluation unit and are arranged in a grid structure. By means of the array of transmitting antennas 4b, the detection device 4, in a turn-on phase with a duration of less than 20 µs, generates an alternating magnetic field covering the actuating member 2, and in particular a coil 5a of an electric resonant circuit 5 integrated into the actuating member 2 and consisting of the coil 5a and a capacitor 5b. Thus, a resonance current, which outlasts the turning off of the alternating magnetic field, is generated in the resonant circuit 5, which in turn generates an alternating electromagnetic field, also referred to as resonance field, which is received by the detection device 4 by means of the receiving antennas 4a, in a turn-off phase having a duration of less than 20 µs that follows the turn-on phase and in which no alternating magnetic field is generated. Since the resonance current is dependent on the position of the coil 5a and thus on the position of the actuating member 2, the detection signal outputted by the detection device 4 to the evaluation unit 9 is dependent on the position of the actuating member 2 relative to the housing 3. Therefore, the evaluation unit 9 is capable, in the case of a given change in position, e.g. by manual pivoting 7 along an axis parallel to the surface 6 or by manual rotation 10 along an axis perpendicular to the surface 6 of the actuating member 2, to assign to this change of position a switching or controlling function of a vehicle component.

The invention claimed is:

1. An input device of a vehicle user interface; comprising:
   a housing, with a detection device assigned to the housing, with
   an evaluation unit connected to the detection device in an electrically conductive manner, and
   with an actuating member movably mounted on the housing, the actuating member including a resonant circuit, wherein:
   the resonance circuit generates a resonance current in response to an alternating magnetic field that is received by the actuating member, the resonance current being dependent on a position of the actuating member, and generates a resonance field based on the generated resonance current;
   the detection device detects the resonance field and transmits a detection signal including at least one position parameter that indicates a position or a change of position of the actuating member relative to the housing to the evaluation unit (9);

the evaluation unit is designed to carry out a switching or controlling function of a vehicle component depending on the position parameter; and the detection device comprises an array of means generating the magnetic measuring field, and that a resonant circuit consisting of at least one coil and at least one capacitor is assigned to the actuating member, and the detection device is designed to detect an electromagnetic resonance field of a resonance current induced in the resonant circuit by the magnetic measuring field.

2. The input device according to claim 1, wherein the actuating member is rotatably mounted on the housing.

3. The input device according to any one of the preceding claims, wherein the actuating member is pivotably mounted on the housing.

4. The input device according to any one of the preceding claims, wherein the detection device comprises an array of transmitting antennas.

5. The input device according to claim 4, wherein the means generating the magnetic measuring field are moved synchronously with the actuating member.

6. The input device according to the claim 5, wherein a permanent magnet is assigned to the actuating member.

7. The input device according to claim 5, wherein the detection device comprises at least one Hall sensor.

8. Use of the input device according to claim 1.

* * * * *